United States Patent [19]
Ehiro

[11] Patent Number: 5,327,074
[45] Date of Patent: Jul. 5, 1994

[54] INTEGRATED CIRCUIT DEVICE

[75] Inventor: Masayuki Ehiro, Nara, Japan

[73] Assignee: Sharp Kabushiki Kaisha, Osaka, Japan

[21] Appl. No.: 805,002

[22] Filed: Dec. 10, 1991

[30] Foreign Application Priority Data

Dec. 19, 1990 [JP] Japan .................. 2-403716

[51] Int. Cl.⁵ ............................................. G01R 31/28
[52] U.S. Cl. ................................................. 324/158.1
[58] Field of Search .............. 324/158 F, 158 R, 73.1;
371/22.5, 22.6

[56] References Cited

U.S. PATENT DOCUMENTS

| 4,038,648 | 7/1977 | Chesley | 324/73.1 |
| 4,486,705 | 12/1984 | Stopper | 324/73.1 |
| 4,956,602 | 9/1990 | Parrish | 324/158 R |
| 4,961,053 | 10/1990 | Krug | 324/158 R |

FOREIGN PATENT DOCUMENTS

| 62-140726 | 7/1987 | Japan . |
| 1140651 | 6/1989 | Japan . |
| 1227081 | 9/1989 | Japan . |
| 1239950 | 9/1989 | Japan . |

Primary Examiner—Ernest F. Karlsen

[57] ABSTRACT

An integrated circuit device is provided with: a substrate; and a plurality of integrated circuit elements formed on the substrate and insulated to each other. Each of the integrated circuit elements includes an internal circuit for performing a predetermined operation when a predetermined electric power is supplied thereto, and an electric source terminal connected to the internal circuit for supplying the predetermined electric power. The integrated circuit device is also provided with a connecting device for electrically connecting one electric source terminal of one integrated circuit element to another electric source terminal of another integrated circuit element, wherein the predetermined electric power is supplied to both of one and another electric source terminals simultaneously through the connecting device so as to simultaneously perform a burn-in process of one and another integrated circuit elements.

11 Claims, 3 Drawing Sheets

INTEGRATED CIRCUIT DEVICE

BACKGROUND OF THE INVENTION

1. Field of the Invention

The present invention relates to an integrated circuit device, such as a semiconductor integrated circuit device, which is manufactured, for example, by forming a plurality of integrated circuit elements on a silicon wafer.

2. Description of the Related Art

In the manufacture of such an integrated circuit device, the burn-in process is performed after forming the internal circuit of each integrated circuit element. This burn-in process is performed basically by driving the internal circuit in an operating condition similar to the real operating condition, with a purpose to find out a certain failure in this condition in the defective internal circuit, which is most likely to become defective in the early period of the actual usage of the manufactured integrated circuit element, so that the integrated circuit element including such a defective internal circuit may be distinguished from the integrated circuit element which does not include such a defective internal circuit. Accordingly, by performing this burn-in process and eliminating such a defective integrated circuit element, the above-mentioned failure found in the burn-in process, can be prevented from really happening in the actual usage of the manufactured integrated circuit.

In the manufacture of this kind of integrated circuit device, insulating belt portions are formed from electrically-insulating material, such as silicon dioxide ($SiO_2$) on a wafer into a lattice shape, so as to make a plurality of rectangular wafer regions separated from each other by the insulating belt portions. Then, on each of the separated rectangular wafer regions, the integrated circuit element is formed. On each of the formed integrated circuit elements, there are formed electric source pads, for supplying a driving electric power to the integrated circuit element, and an internal circuit, to which the driving electric power is supplied via the electric source pad, for performing a predetermined operation by use of the supplied electric power.

At the stage that the formation of a plurality of integrated circuit elements are completed on the wafer in this manner, the burn-in process is performed. More specifically, the burn-in process is performed by use of the exclusive burn-in device, namely, by connecting the connecting socket of the burn-in device to the electric source pad of each integrated circuit element.

In the case that the integrated circuit device to be manufactured is a microprocessor device or a logic array device, when the integrated circuit element is set to the burn-in device for the burn-in process, an automatic setting apparatus is not utilized. Instead, a manual setting operation is performed to set the integrated circuit element to the burn-in device. In this operation, the type of manufacture of the integrated circuit device, has disadvantages of increasing the manufacturing time and cost.

Further, when the dynamic burn-in process is performed to the integrated circuit device, the proper electric connections must be realized by connecting each of the integrated circuit devices, respectively to each connecting socket equipped on another exclusive dynamic burn-in device. This results in the drastic increase of the difficulty and time of the manufacture.

Furthermore, in the case of performing this dynamic burn-in process, it is necessary to use such a dynamic burn-in device process, it is necessary to use such a dynamic burn-in device as can be realized by employing a rather sophisticated computer etc., and to externally control the internal circuit according to a predetermined program so as to operate the internal circuit in a condition similar to the real operating condition.

In this manner, the burn-in process including the dynamic burn-in process, can be performed with respect to the integrated circuit device, so that the defective integrated circuit device can be prevented from being produced as a final product, according to the above mentioned related art.

However, according to this related art integrated circuit in association with this related art burn-in process, since the burn-in device is furnished with a computer etc. to execute the predetermined program, the construction of the burn-in device becomes large and complicated as well as expensive. Since the rather complicated program is to be performed under the control of the external burn-in device, the burn-in process itself becomes a time and cost consuming process.

In this manner, the related art integrated circuit device, in association with its burn-in device, has a serious problem that it requires the time and cost consuming burn-in process.

SUMMARY OF THE INVENTION

It is therefore an object of the present invention to provide an integrated circuit device including a plurality of integrated circuit elements on a substrate, to which a burn-in process can be applied in a simple and efficient manner by use of a relatively simple burn-in device.

According to the present invention, the above mentioned object can be achieved by an integrated circuit device provided with: a substrate; and a plurality of integrated circuit elements formed on the substrate and insulated to each other. Each of the integrated circuit elements includes an internal circuit for performing a predetermined operation when a predetermined electric power is supplied thereto, and an electric source terminal connected to the internal circuit for supplying the predetermined electric power. The integrated circuit device is also provided with a connecting device for electrically connecting one electric source terminal of one integrated circuit element to another electric source terminal of another integrated circuit element, wherein the predetermined electric power is supplied to both of one and another electric source terminals simultaneously through the connecting device so as to simultaneously perform a burn-in process of one and another integrated circuit elements.

In the integrated circuit device, since the connecting device, such as a connecting line made of electrically conductive material for example, electrically connects the electric source terminals of different integrated circuit elements to each other, the predetermined electric power can be simultaneously supplied to a plurality of integrated circuit elements just by applying one common electric power to one of the electric source terminals or one portion of the connecting device, which are all made in an electrically connected condition. Thus, the internal circuit of each integrated circuit element can perform its predetermined operation when this predetermined electric power is supplied through the connecting device and the electric source terminal.

Consequently, the burn-in process can be simultaneously performed with respect to a plurality of integrated circuit elements. If all of the electric source terminals are connected to each other, for example, the burn-in process for all of the integrated circuit elements can be simultaneously performed in one lot. In this manner, the present invention brings a great advantage of reducing the time and cost of the burn-in process by use of a relatively simple burn-in device to supply one common predetermined electric power. It is also advantageous that the integrated circuit device of the present invention can be constructed as a relatively simple device such as a semiconductor integrated circuit device on a wafer with a connecting device such as connecting line made by a patterning technique on the wafer, for example.

Further, regardless of the type or scale of the integrated circuit element to be manufactured, the burn-in process can be performed in one lot as for one substrate, such as one wafer for example, so that the manufacturing process can be drastically simplified.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 1:
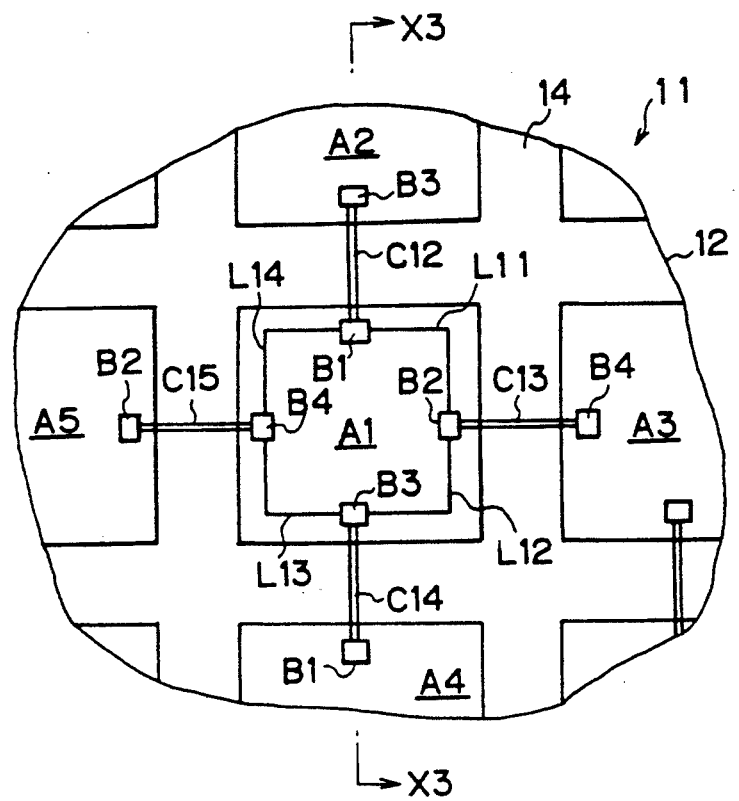
FIG. 1 is a magnified plan view of an integrated circuit device as a first embodiment of the present invention.

FIG. 1 shows an integrated circuit device as a first embodiment of the present invention.

In FIG. 1, an integrated circuit device 11 includes a wafer 12, and a plurality of integrated circuit elements A1, A2, A3, ... (which will be generically referred as A) arranged in a matrix manner on the wafer 12.

The wafer 12 may be made from silicon, for example, such as mono-crystalline silicon, amorphous silicon, etc. or made from sapphire, glass, and so on.

On the wafer 12, there are also formed a plurality of insulating belt portions 14, which are made from electric insulating material such as silicon dioxide ($SiO_2$) in a lattice shape, wherein each of the integrated circuit elements A are formed in each of the rectangular wafer regions prescribed by the insulating belt portions 14.

On the integrated circuit element A1, there are formed electric source pads B1, B2, B3 and B4 (which will be generically referred as B) in the vicinity of each edge of the integrated circuit element A1. The electric source pads B are made by patterning aluminum for example.

The electric source pads B are connected to each other by electric source lines L11, L12, L13 and L14 (which will be generically referred as L), which are also formed by patterning aluminum etc., along the external circumference of the rectangular shape of the integrated circuit element A1. As for the other integrated circuit elements A2, A3, A4, ..., the electric source pads B and the electric source lines L are also formed in the same manner to have the same construction as the above explained integrated circuit element A1.

In each direction along the edge of the integrated circuit element A1, the integrated circuit elements A2 to A5 are located adjacent to the integrated circuit element A1. The electric source pads B1 to B4 are connected to the opposing electric source pads B3, B4, B1 and B2 of the adjacent integrated circuit elements A2, A3, A4 and A5 respectively, by connecting lines C12, C13, C14 and C15 (which will be generically referred as C). The connecting lines C are formed by patterning conductive material such as aluminum, polysilicon, etc., on the wafer 12.

In the same manner as the above explained integrated circuit element A1, all of the other integrated circuit elements A2, A3, A4, ... on the wafer 12, are connected to the corresponding adjacent integrated circuit elements by the connecting lines C.

Figure 2:
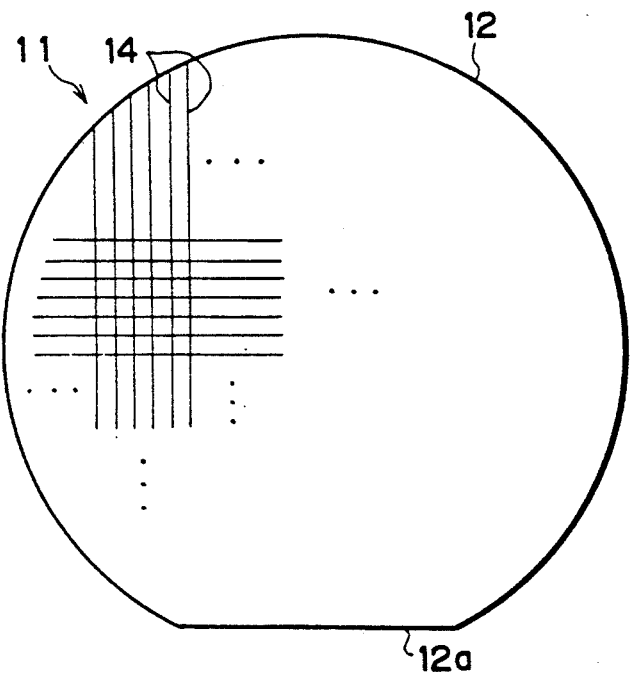
FIG. 2 is a plan view of a wafer on which the integrated circuit device of FIG. 1 is formed.

FIG. 2 shows the whole figure of the integrated circuit device 11 including the wafer 12 having the orientation flat 12a, on which the above-mentioned integrated circuit elements A, the insulating belt portions 14, the connecting lines C etc., are formed.

Figure 3:
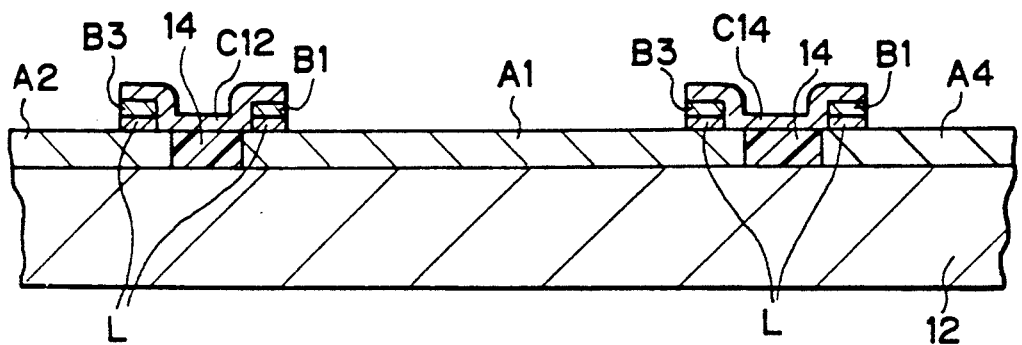
FIG. 3 is a X3—X3 cross sectional view of the integrated circuit device of FIG. 1.

FIG. 3 shows the X3—X3 cross sectional view of the integrated circuit device 11 of FIG. 1. As can be seen from FIG. 3, the integrated circuit elements A and the insulating belt portions 14, are formed on the wafer 12, while the electric source lines L are formed on the integrated circuit elements A. Further, the electric source pads B are formed on the electric source lines L, and the connecting lines C connects the electric source pads B to each other.

Figure 4:
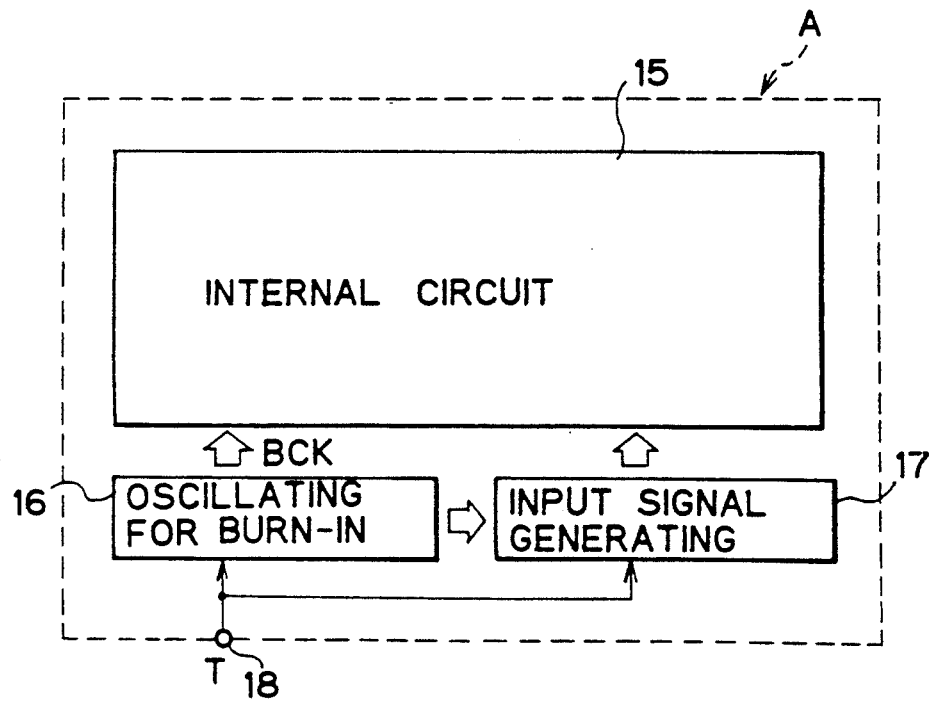
FIG. 4 is a block diagram of an internal construction of the integrated circuit element of the integrated circuit device of FIG. 1.

FIG. 4 shows the internal construction of the integrated circuit element A.

In FIG. 4, the integrated circuit element A is provided with an internal circuit 15, an oscillating circuit 16 exclusive to the burn-in process, an input signal generating circuit 17 exclusive to the burn-in process, and a burn-in control terminal 18.

The internal circuit 15 is constructed corresponding to the predetermined operation, which is to be performed and set in advance. The oscillating circuit 16 is adapted to generate a clock signal BCK which is necessary for the burn-in process with respect to the internal circuit 15. The input signal generating circuit 17 is adapted to generate various control signals and data signals which are also necessary to make the internal circuit 15 operate for the burn-in process.

The burn-in control terminal 18 is commonly connected to the oscillating circuit 16 and the input signal generating circuit 17, such that they are operated by a burn-in control signal T, which is an electric source voltage signal for example, and is supplied to them through the burn-in control terminal 18. That is to say, the oscillating circuit 16 performs the oscillating operation with a predetermined frequency based on the input of the burn-in control signal T as the driving electric source voltage with a constant level. Then, the generated clock signal BCK is inputted to the internal circuit 15. At the same time, the clock signal BCK as well as the burn-in control signal T, is inputted to the input signal generating circuit 17, so that the aforementioned various signals are generated by the input signal generating circuit 17, which are inputted to the internal circuit 15, so as to enable the burn-in process in the internal circuit 15.

Figure 5:
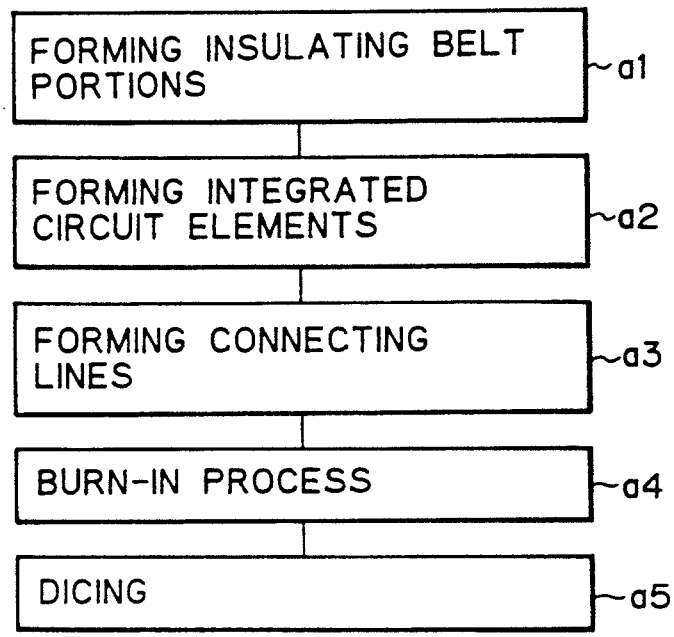
FIG. 5 is a process chart showing the manufacturing process of the integrated circuit device of FIG. 1.

FIG. 5 is a process chart showing the manufacturing process of the integrated circuit device 1.

In FIG. 5, at the process a1, the insulating belt portions 14 are formed into a lattice shape on the wafer 12, which is made from mono-crystalline silicon for example, by oxidizing the surface of the wafer 12 and masking the portions to form the integrated circuit elements A. Then, at the process a2, each integrated circuit element Ai (i=1, 2, 3, ...) is formed in each rectangular wafer region prescribed by the insulating belt portions 14. At this time, each electric source pad Bj (j=1 to 4) and each electric source line Lik (k=1 to 4) as explained before with FIGS. 1 to 3, are formed on each integrated circuit element Ai. Then, at the process a3, as explained before with FIG. 1, each connecting line Cim (m=1, 2, 3, ...) for connecting each opposing electric source pad Bj of each adjacent integrated circuit element Ai to each other, is formed, so that each electric source pad Bj of all integrated circuit elements A on the wafer 12 as shown in FIG. 2, are connected to each other.

At the process a4, the aforementioned burn-in control signal T is supplied, via each connecting line Cim, to each integrated circuit element Ai on the wafer 12, and all of the electric source pads Bj are connected to each other. Since the electric source pads Bj are all connected, the burn-in control signal T can be commonly inputted to all of the integrated circuit elements A simultaneously, so that the oscillating circuit 16 in each of the integrated circuit elements A, outputs the clock signal BCK, and the clock signal BCK and the burn-in control signal T are inputted to the input signal generating circuit 17 to generate the aforementioned various control signals and data signals necessary for the predetermined operation of the internal circuit 15 as shown in FIG. 4. Accordingly, the internal circuit 15 can be driven in an operating condition substantially the same as the real operating condition, and thus the burn-in process can be performed.

Then, at the step a5, the wafer 12, to which the burn-in process is completed, is divided into pieces of the integrated circuit elements A, by dicing the wafer 12 with a dicing device etc., so that each integrated circuit element A can be individually obtained.

As described above, according to the integrated circuit device 11 of the present embodiment, in order to perform the burn-in process with respect to a large number of the integrated circuit elements A, the burn-in process can be performed simultaneously with respect to the wafer 12 as one unit. Thus, the process number required for the burn-in process, can be drastically decreased and the manufacturing process can be simplified on the whole, in addition to reducing the time required for the manufacture by a great degree. Further, since the burn-in process to the integrated circuit device 11 of the present invention, can be performed by just supplying the burn-in control signal T, which is a constant voltage signal, to the connecting lines C, the construction required for performing the burn-in process i.e. the construction of the burn in device, can be made also drastically simplified.

Figure 6:
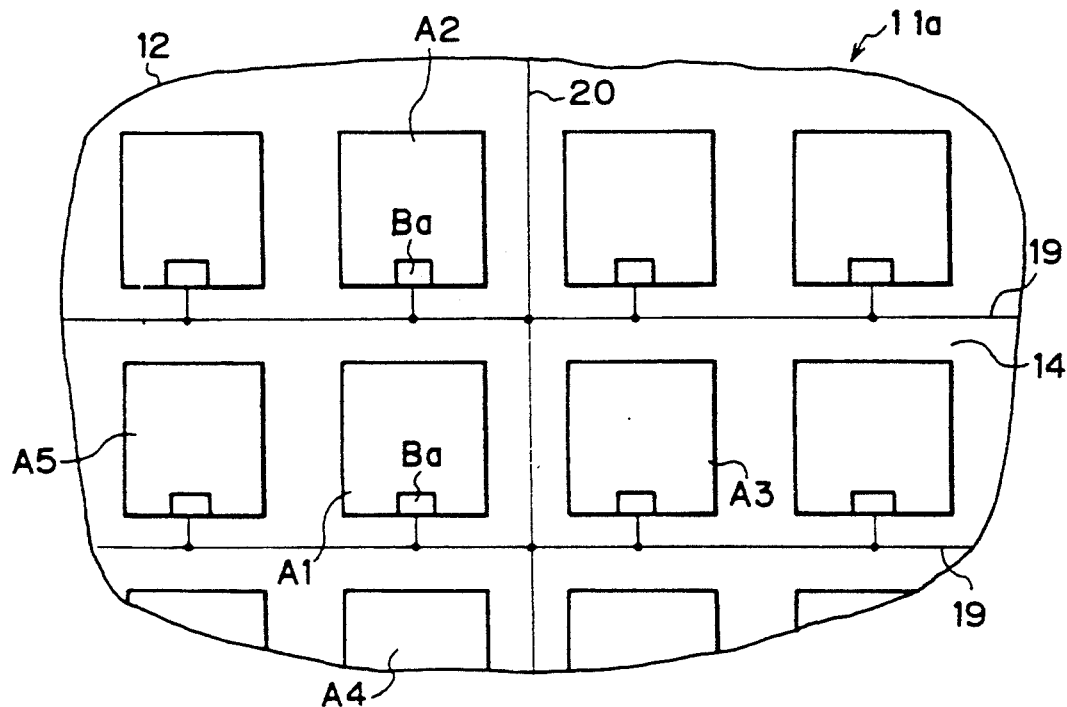
FIG. 6 is a magnified plan view of an integrated circuit device as a second embodiment of the present invention.

FIG. 6 shows an integrated circuit device 11a as a second embodiment of the present invention. In FIG. 6, the same constitutional elements as those in FIG. 1, carry the same reference numerals and the explanations thereof are omitted.

In FIG. 6, each of the integrated circuit elements A is provided with one electric source pad Ba, while the integrated circuit device 11a is provided with a plurality of line direction common connecting lines 19, and a plurality of row direction common connecting lines 20, on the insulating belt portions 14. Each of the line direction common connecting lines 19, extends in the line direction of the matrix i.e. the right and left direction of FIG. 6, and is commonly connected to the electric source pads Ba of the integrated circuit elements arranged on the same line of the matrix. Each of the row direction common connecting lines 20, extends in the row direction of the matrix i.e. the up and down direction of FIG. 6, and is commonly connected to the line direction common connecting lines 19.

Thus, according to the second embodiment, just by supplying the burn-in control signal T to at least one of the line direction common connecting lines 20 and the row direction common connecting lines 20, the burn-in process can be performed with respect to all of the integrated circuit elements A simultaneously in the same manner as the aforementioned first embodiment.

As described above in detail, in the present embodiments, the electric source pads B or Ba of a plurally of integrated circuit element A, which are formed in an electrically insulating condition with each other on the wafer 12, are connected to each other by means of the connecting lines C or 19 and 20. Thus, the electric power can be supplied to each of the integrated circuit elements A via the connecting lines C or 19 and 20 for the burn-in process. Accordingly, the burn-in process can be simultaneously performed with respect to a large number of the integrated circuit elements A in one lot on the whole wafer 12.

Further, regardless of the type or scale of the integrated circuit element A to be manufactured, the burn-in process can be performed in one lot as for one wafer 12, so that the manufacturing process can be drastically simplified.

In the above described embodiments, the position or the number of the electric source pads B on each of the integrated circuit elements A, may be changed, or the arrangement of the connecting lines C, may be changed, depending on the required specification of the integrated circuit element to be manufactured. As long as such a pad member or element as corresponding to the electric source pads B, Ba, to which the electric source voltage is inputted as in the present embodiments, are electrically connected to each other, the integrated circuit device can bring the above mentioned great advantage of the present invention.

Many widely different embodiments of the present invention may be constricted without departing from the spirit and scope of the invention. It should be understood that the present invention is not limited to the specific embodiments described in this specification, except as defined in the appended claims.

What is claimed is:

1. An integrated circuit device comprising:
   a substrate;
   a plurality of integrated circuit elements formed on said substrate in matrix manner and insulated to each other by lattice shaped insulating belt portions, each of said integrated circuit elements including,
an internal circuit for performing a predetermined
a burn-in circuit for performing a burn-in process to said internal circuit when a burn-in control signal is supplied thereto, and
at least two pads connected to each other and to said burn-in circuit for supplying said burn-in control signal to said burn-in circuit; and
burn-in connecting lines extending across said insulating belt portions for electrically connecting one pad of one integrated circuit element to one pad of one of adjacent integrated circuit elements, and another pad of said one integrated circuit to one pad of another adjacent integrated circuit element, so that said one integrated circuit element is electrically connected to said one and another adjacent integrated circuit elements and said one and another adjacent integrated circuit elements are electrically connected to each other through said one integrated circuit element.

2. An integrated circuit device according to claim 1, wherein said substrate comprises a wafer made from a material selected from the group of mono-crystalline silicon, amorphous silicon, sapphire and glass.

3. An integrated circuit device according to claim 1, wherein said insulating belt portions prescribe a plurality of rectangular regions in each of which a respective one of said integrated circuit elements is disposed.

4. An integrated circuit device according to claim 3, wherein said at last two pads are disposed at a peripheral portion of said integrated circuit elements and connected to each other by a conductive line formed along an external circumference of the rectangular shape of the integrated circuit elements.

5. An integrated circuit device according to claim 4, wherein each of said integrated circuit elements has four pads disposed at four edges of said integrated circuit elements, respectively.

6. An integrated circuit device according to claim 5, wherein four burn-in connecting lines are connected to said four pads in each integrated circuit element, respectively, and extend from each integrated circuit element upward, downward, leftward, and rightward, respectively.

7. An integrated circuit device according to claim 1, wherein said burn-in circuit includes an oscillating circuit for generating a clock signal for burn-in process, an input signal generating circuit for generating signals required to conduct the burn-in process, and a burn-in control terminal connected to receive said burn-in control signal.

8. An integrated circuit device according to claim 7, wherein said burn-in control signal has a predetermined constant level electric power.

9. An integrated circuit device according to claim 8, wherein said at least two pads are electric source pads, and connected to each other by a source line formed along an external circumference of the integrated circuit elements.

10. An integrated circuit device according to claim 9, wherein electrical connections between two adjacent integrated circuit elements are realized by a burn-in connecting line through an electric source pad connected to a source line in one integrated circuit element and through an electric source pad connected to a source line in the other integrated circuit element.

11. An integrated circuit device according to claim 1, wherein said burn-in connecting line connecting two adjacent integrated circuit elements extends perpendicularly to adjacent sides of said two integrated circuit elements.

* * * * *